United States Patent [19]
Long et al.

[11] Patent Number: 5,213,249
[45] Date of Patent: May 25, 1993

[54] ULTRASONIC ADHESION/DEHESION MONITORING APPARATUS WITH POWER FEEDBACK MEASURING MEANS

[75] Inventors: David C. Long, Wappingers Falls; Krishna Seshan, Beacon, both of N.Y.

[73] Assignee: International Business Machines Corporation, Armonk, N.Y.

[21] Appl. No.: 890,988

[22] Filed: May 29, 1992

[51] Int. Cl.⁵ ......................................... H01L 21/607
[52] U.S. Cl. .................................... 228/102; 228/110;
228/1.1; 228/8; 156/73.2; 156/580.1; 73/582
[58] Field of Search ............... 228/102, 104, 110, 111,
228/1.1, 8; 73/582; 156/73.1, 73.2, 378, 580.1

[56] References Cited

U.S. PATENT DOCUMENTS

| | | | |
|---|---|---|---|
| 4,341,574 | 7/1982 | Landes | 156/64 |
| 4,606,490 | 8/1986 | Chan et al. | 228/103 |
| 4,746,051 | 5/1988 | Peter | 228/110 |
| 4,815,001 | 3/1989 | Uthe et al. | 228/103 |
| 5,046,654 | 9/1991 | Yamazaki et al. | 228/102 |

FOREIGN PATENT DOCUMENTS 660799  5/1979  U.S.S.R. .................. 228/110

OTHER PUBLICATIONS

J. R. Behun, et al., IBM Research Disclosure, Entitled "Ultrasonic Method to Remove Chips Mounted on Ceramic or of Other Materials Substrates", Aug. 1991, No. 328.

*Primary Examiner*—Samuel M. Heinrich
*Attorney, Agent, or Firm*—Ira David Blecker

[57] ABSTRACT

An ultrasonic adhesion/dehesion monitoring apparatus for monitoring the adhesion/dehesion between first and second substrates comprising: a. an ultrasonic source for transmitting ultrasonic energy to at least first and second substrates; b. means for measuring the instantaneous AC current and instantaneous AC supplied to said ultrasonic source; c. means for multiplying the instantaneous AC voltage and the instantaneous AC current to determine the instantaneous power supplied to said ultrasonic source; and d. monitor means coupled to said ultrasonic source and said power determining means for monitoring the instantaneous power supplied to said ultrasonic source. Also disclosed is a method for monitoring the quality and/or adhesion/dehesion between first and second substrates in the ultrasonic adhesion/dehesion monitoring apparatus.

5 Claims, 4 Drawing Sheets

ULTRASONIC ADHESION/DEHESION MONITORING APPARATUS WITH POWER FEEDBACK MEASURING MEANS

RELATED APPLICATION

This Application is related to Long et al, "Ultrasonic Adhesion/Dehesion Monitoring Apparatus With Acoustic Transducer Means" filed even date herewith.

BACKGROUND OF THE INVENTION

This invention relates to ultrasonic apparatus primarily used for wire bonding but also used for various other processes such as semiconductor chip and input/output (I/O) pin removal. More particularly, this invention relates to an apparatus for monitoring the adhesion of the wire during bonding and the dehesion of a semiconductor chip and I/O pin during removal.

The process of ultrasonic bonding is well known. Briefly, in ultrasonic bonding, the bonding tool is caused to vibrate at ultrasonic frequency while the wire end is applied under pressure to the portion of the body to which electrical connection is to be made.

A recognized problem of ultrasonic bonding is that the bond quality can vary appreciably from bond to bond on a given substrate even where bonding machine settings are nominally identical. One very important factor involved in the bond quality is the bond strength. In some cases, low strength bonds can be identified visually such as where there are defects apparent. However, in most cases no estimation of the strength of the bond can be made without destructively pulling or shear testing the bond. This is not very practical since all bonds cannot be tested and the few marginal bonds present a serious reliability problem. At the present time, there are no commercially available ultrasonic wire bonding apparatus having provisions for the in-situ monitoring the bond quality and/or strength.

Landes U.S. Pat. No. 4,341,574 discloses an ultrasonic wire bond monitoring apparatus which determines the electrical impedance of the ultrasonic generator and then, based on the second derivative of the impedance, turns the bonding tool on or off. The monitoring apparatus can also determine when there is no wire in the bonding tool and when the tool is not making contact with the wire.

Chan et al. U.S. Pat. No. 4,606,490 discloses an ultrasonic wire bond monitoring apparatus which measures the current from the ultrasonic generator over time to generate a current envelope. The current envelope is compared with previously determined current envelopes to determine if a good bond is being made.

The current state of the art approaches to the problem have thus far failed to reliably distinguish bad bonds from good bonds. The present inventors have, therefore, proposed an apparatus to reliably detect when a good ultrasonic bond has been made.

The use of an ultrasonic apparatus to remove or debond parts is less well known. Behun et al., "Ultrasonic Method to Remove Chips Mounted on Ceramic or of Other Materials Substrates", Research Disclosure, No. 328 (August, 1991), the disclosure of which is incorporated by reference herein, discloses the ultrasonic removal of chips from a ceramic substrate. Basically, a chip remove stud is adhered to the backside of a chip. The chip has been previously joined to the ceramic substrate via solder controlled collapse chip connections. The chip remove stud is attached to the horn of the ultrasonic tool. Upon the application of ultrasonic energy and an upward force, the solder connections break and the chip becomes debonded or dehered.

A problem with this method of chip removal, as discovered by the present inventors, is that as more of the solder connections become broken, the chip begins to vibrate to a greater extent. This follows from the fact that as the solder connections become broken, a constant amount of ultrasonic energy is being applied to a decreasing number of solder connections. Consequently, when the last of the solder connections are broken, the chip abruptly debonds or deheres from the substrate with frequent damage to the chip and the substrate.

The present inventors, therefore, have proposed an apparatus to monitor the adhesion of the chip to the substrate so that upon detecting a lessening of such adhesion, the power to the ultrasonic tool can be lessened to alleviate the abrupt debonding or dehering of the chip from the substrate.

It should be understood that the terms dehere and dehesion mean the opposite of adhere and adhesion and indicate the debonding or separating of components from a substrate.

Similar considerations apply to the abrupt removal of I/O electrical connector pins from a substrate.

It is, accordingly, a purpose of the present invention to have a monitoring apparatus to reliably detect when a good ultrasonic bond, for example between a wire and a substrate, has been made.

It is another purpose of the present invention to have a monitoring apparatus that regulates and varies the ultrasonic power according to the current adhesion conditions so as to perform chip removal, pin pull and the like without undue harm to the substrate.

These and other purposes of the invention will become more apparent after referring to the following description considered in conjunction with the accompanying drawings.

BRIEF SUMMARY OF THE INVENTION

Disclosed according to one aspect of the invention is an ultrasonic adhesion/dehesion monitoring apparatus for monitoring the adhesion/dehesion between first and second substrates comprising:

a. an ultrasonic source for transmitting ultrasonic energy to at least first and second substrates;

b. means for measuring the instantaneous AC current and instantaneous AC voltage supplied to said ultrasonic source;

c. means for multiplying the instantaneous AC voltage and the instantaneous AC current to determine the instantaneous power supplied to said ultrasonic source; and d. monitor means coupled to said ultrasonic source and said power determining means for monitoring the instantaneous power supplied to said ultrasonic source.

Disclosed according to a second aspect of the invention is a method for monitoring the adhesion/dehesion between first and second substrates in an ultrasonic adhesion/dehesion monitoring apparatus comprising an ultrasonic source for transmitting ultrasonic energy to at least first and second substrates, the method comprising the steps of:

a. measuring the instantaneous AC current and instantaneous AC voltage supplied to the ultrasonic source;

b. multiplying the instantaneous AC voltage and the instantaneous AC current to determine the instantaneous power supplied to the ultrasonic source; and c. coupling monitor means to the ultrasonic source and to the power determining means for monitoring the power supplied to the ultrasonic source.

DETAILED DESCRIPTION OF THE INVENTION

Figure 1:
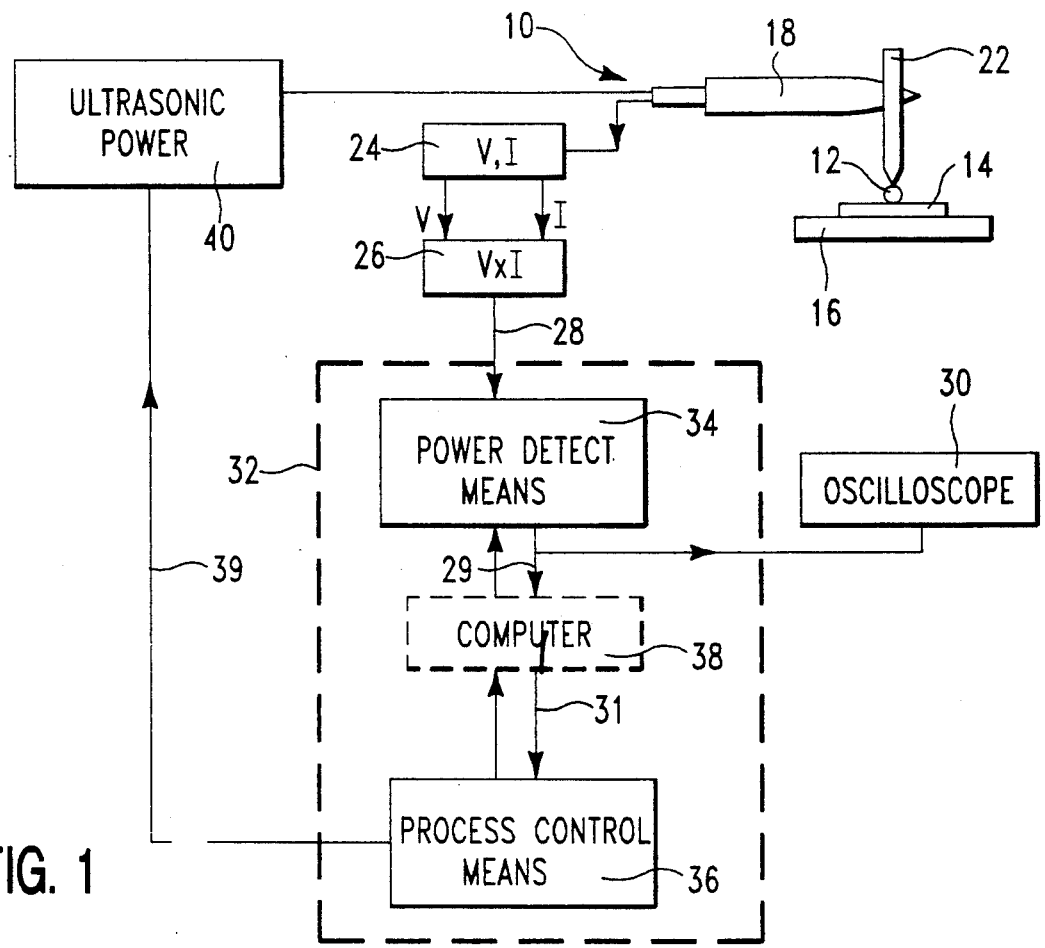
FIG. 1 is a schematic block diagram of a first embodiment of the ultrasonic adhesion/dehesion monitoring apparatus according to the invention.

Referring to the figures in more detail, and particularly referring to FIG. 1, there is shown an ultrasonic adhesion/dehesion monitoring apparatus, generally indicated by 10, for monitoring the adhesion/dehesion between first substrate 12 and second substrate 14. The first 12 and second 14 substrates are resting on fixture 16.

The apparatus 10 includes an ultrasonic source 18 for transmitting ultrasonic energy to the first 12 and second 14 substrates. As shown in the figures, the ultrasonic source 18 is a transducer or horn vibrating at a frequency of about 60 kHz., which is typical for ultrasonic devices. The ultrasonic energy is directly transmitted to the substrates 12, 14 through a tip 22 or some other similar device. There must be some direct or indirect contact between the ultrasonic energy source 18 and the substrates 12, 14 since the ultrasonic energy does not effectively travel through air for the purposes of the present invention.

The apparatus 10 further includes means 24 for measuring the instantaneous AC current and instantaneous AC voltage from the ultrasonic source 18. The instantaneous AC voltage may be measured directly across the terminals of the ultrasonic source 18. On the other hand, the instantaneous AC current may be measured indirectly with a device such as a current probe or current sensing resistor. By use of these devices, the current output is translated to a value in volts.

Figure 2:
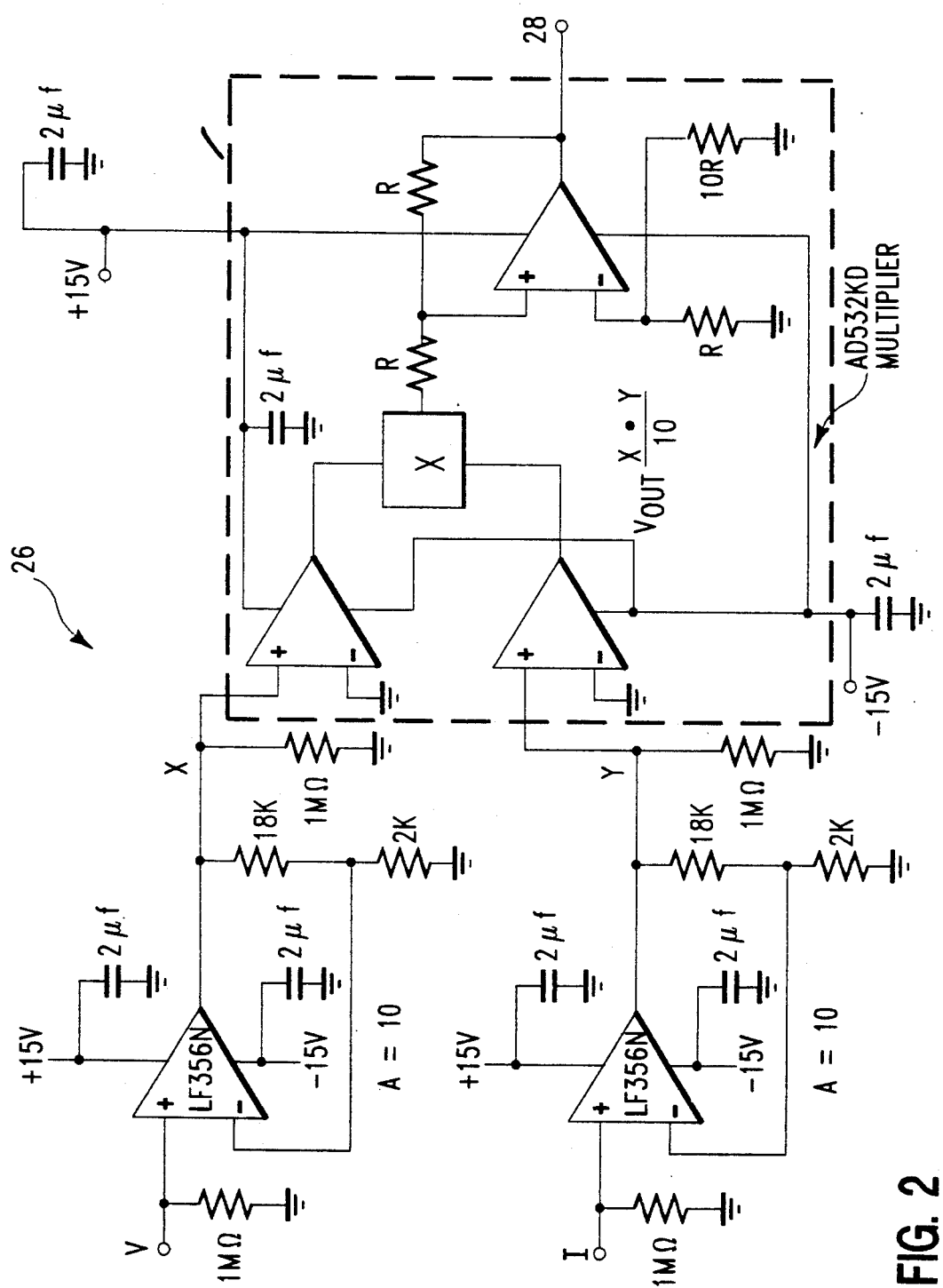
FIG. 2 is a circuit diagram of the means for measuring the instantaneous power supplied to the ultrasonic source of the apparatus according to the invention.

The instantaneous AC voltage and instantaneous AC current outputs are fed to means 26 for multiplying the instantaneous AC voltage times the instantaneous AC current to determine the power supplied to the ultrasonic source 18. A circuit schematic for performing the multiplier function is given in FIG. 2. The instantaneous AC voltage and instantaneous AC current outputs from measuring means 24 are fed to multiplier means 26 with the result being a voltage proportional to power supplied to the ultrasonic source 18 at 28.

The output 28 is coupled to monitor means 32. Monitor means 32 provides a means for automating the monitoring and control of the apparatus 10 by monitoring the power supplied to the ultrasonic source 18. The output 28 from multiplier means 26 is fed to monitor means 32 which includes power detect means 34 for detecting the power supplied to the ultrasonic source 18. Also included is process control means 36 responsive to the power detecting means 34 for regulating the power of the ultrasonic source 18. Computer 38 may form a part of the process control means 36 or power detect means 34 or may be a separate unit. The output from process control means 36 is fed to ultrasonic power unit 40, which power is then regulated according to the signal received by the process control means 36 from the power detect means 34. If desired, the power may simply be turned on or off or varied to optimize the bonding conditions. Ultrasonic power unit 40 is typically powered by conventional AC power.

Figure 3:
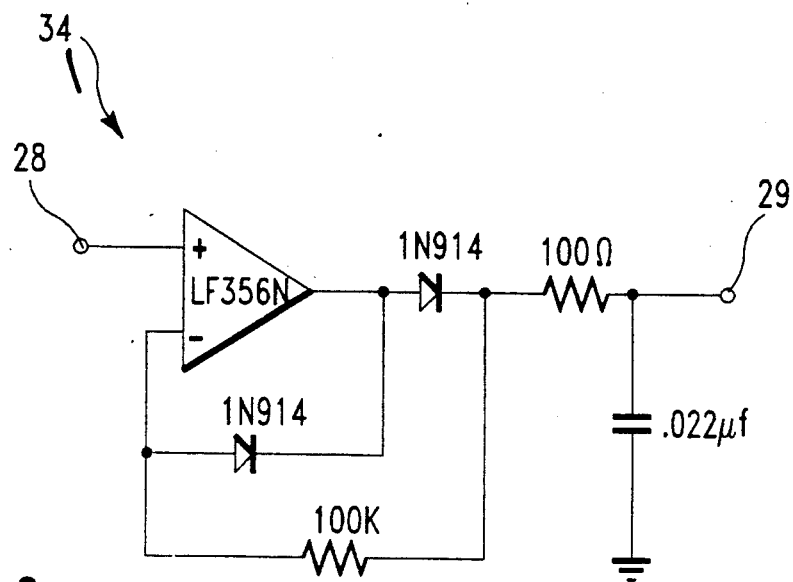
FIG. 3 is a circuit diagram of the means for detecting the power supplied to the ultrasonic source of the apparatus according to the invention.

A schematic diagram of a circuit for performing the function of the power detect means 34, is shown in FIG. 3. Output 28 from the V x I multiplier means 26 is processed with resulting output 29 being generated. Power detect means 34 is also called an envelope detector circuit with smoothing filter.

Figure 5:
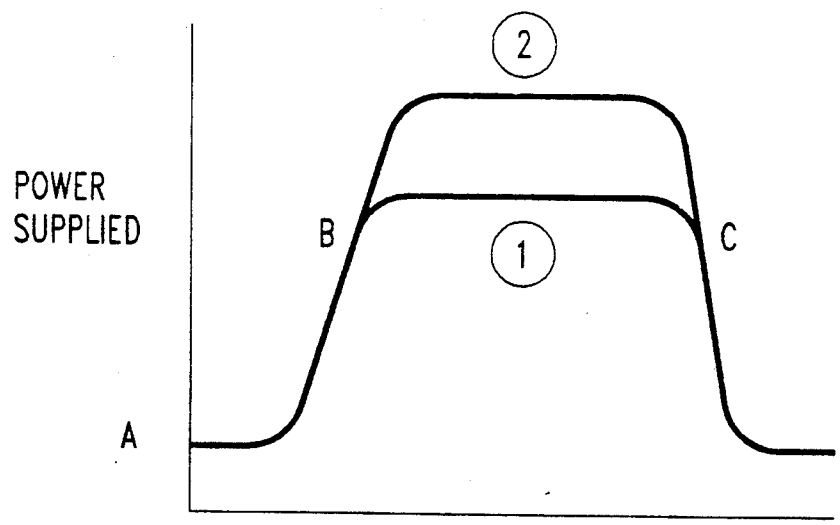
FIG. 5 is a diagrammatic representation of the power supplied during wire bonding.

If desired, output 29 may be fed to oscilloscope 30 or a plotter (not shown). The present inventors have found the oscilloscope 30 useful for monitoring the power from ultrasonic adhesion/dehesion apparatus 10. In one embodiment of the invention, substrate 12 is a wire and substrate 14 is a ceramic substrate with metal pads for bonding and it is desirable to monitor the bonding of the wire 12 to a metal pad on the substrate 14. FIG. 5 is a diagrammatic representation of a wire bonding operation. Referring first to curve 1 of FIG. 5, there is power up of the apparatus at point A. At point B, wire bonding begins and is completed at point C. Once bonding is complete, the power may be reduced. Curve 2 schematically represents the tip 22 freely vibrating in air before contact with substrates 12, 14.

The method of the present invention is thus useful for detecting when a good bond has been achieved.

Figure 4A:
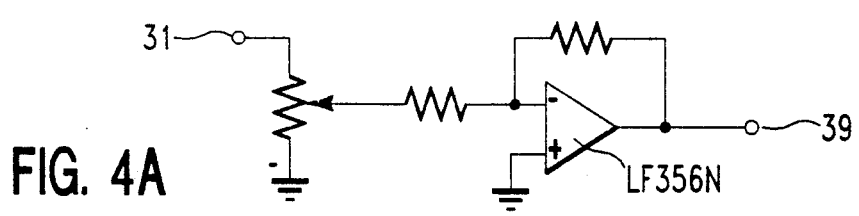
FIGS. 4A and 4B are schematic circuit diagrams of the process control means of the apparatus according to the invention.
Figure 4B:
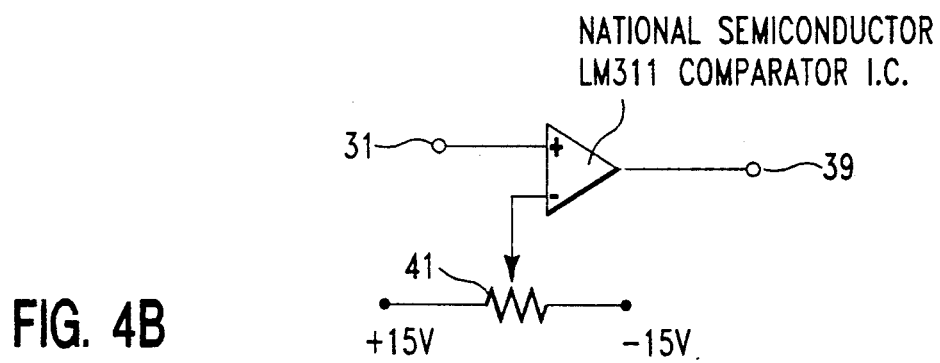

Shown in FIGS. 4A and 4B are schematic circuit diagrams of process control means circuits which are suitable for performing some of the functions of the process control means 36. FIG. 4A is a buffer amplifier which processes output 31 from the power detect means 34 and generates an output 39 which varies the power of the ultrasonic power unit 40 in response to bonding or debonding conditions. FIG. 4B, on the other hand, is a comparator circuit which simply causes the power in ultrasonic power unit 40 to be turned on or off in response to bonding or debonding conditions. The variable resistor 41 acts as a trip level set point control to set the condition under which the power will be turned on or off.

Figure 6:
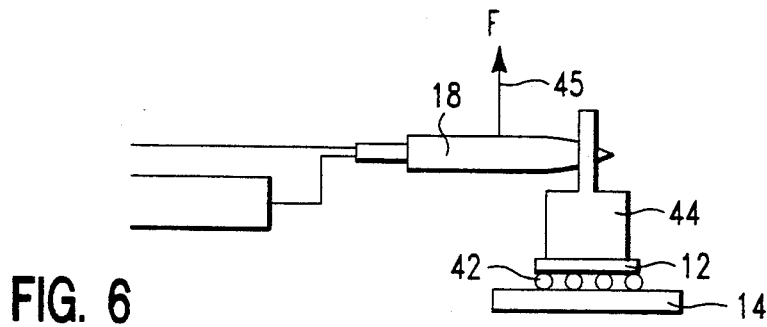
FIG. 6 is a schematic diagram of a second embodiment according to the invention as used for chip removal.

In another embodiment of the invention, as shown in FIG. 6, it is desired to monitor the dehesion condition during the removal of a chip from a substrate. In this case, substrate 12 is a chip and substrate 14 is a ceramic substrate. The chip 12 is adhered to the ceramic substrate 14 by solder balls 42. Stud 44 is adhered to the top of the chip 12 with Superglue cyanoacrylate adhesive, or some other fast drying adhesive. Upward force 45 is applied to horn 18. Ultrasonic energy is transmitted from horn 18 to stud 44 and then to substrates 12, 14.

The ultrasonic energy causes the solder balls 42 to fracture and, in conjunction with upward force 45, causes the separating of the chip 12 from the ceramic substrate 14. The dehesion of the chip 12 to the ceramic substrate 14 may be monitored by the apparatus according to the invention until the substrates 12, 14 become separated. The invention may also be practiced with other demountable components such as chip resistors, chip transistors, surface mount components, etc.

Figure 8:
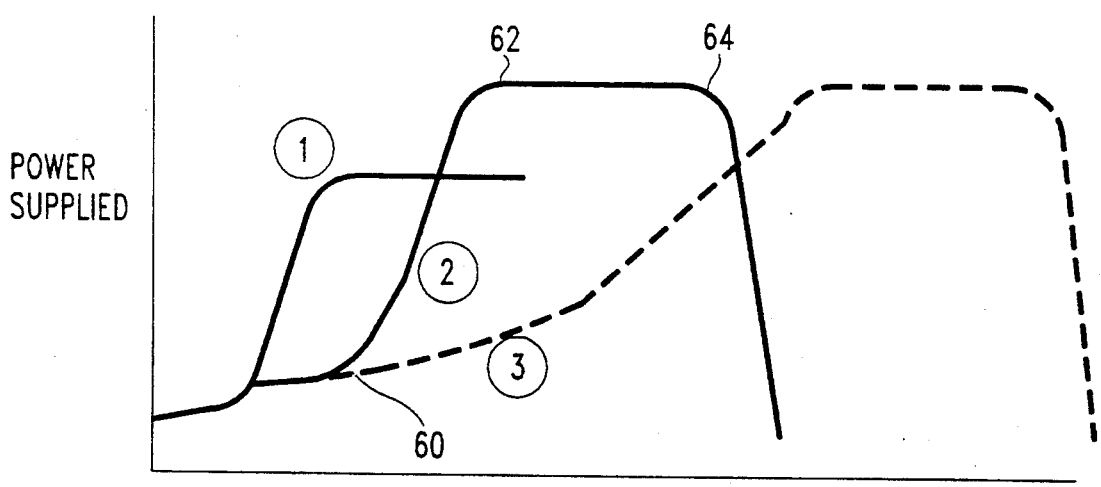
FIG. 8 is a diagrammatic representation of the power supplied during chip removal.

A diagrammatic representation of the signal viewed from oscilloscope 30 is shown in FIG. 8, wherein power supplied to the ultrasonic source is plotted versus time. Curve 1 illustrates the signal with the stud 44 attached to the horn 18 and freely vibrating in air. Curve 2 illustrates the signal when the stud 44 is adhered to the chip 12. The initial signal in curve 2 indicates that the substrates 12, 14 are adhered. As more energy is input to the substrates 12, 14, the solder balls 42 begin to fracture at point 60. At about point 62 on curve 2, the last of the solder balls 42 break and the substrates 12, 14 become separated, with the stud and attached chip now freely vibrating in air. Power is shut off at point 64. It is desirable, however, to ramp down the ultrasonic power between points 60 and 62 to lessen the stress effect of the fracture of the solder balls 42 upon substrate 14 and/or to avoid the sudden dehering or debonding of the substrates 12, 14. By using oscilloscope 30, ramp down of the power between points 60 and 62, or shutting off the power once point 62 is reached, may be accomplished manually. Alternatively, monitoring means 32 may do this automatically. According to the invention, the ramp down of the power may be accomplished as shown in curve 3 sometime after point 60 is reached. Ramping down of the power results in fracture of the solder balls 42 which is gentler to the last solder balls 42 to be fractured and also to the substrate 14 pads.

Figure 7:
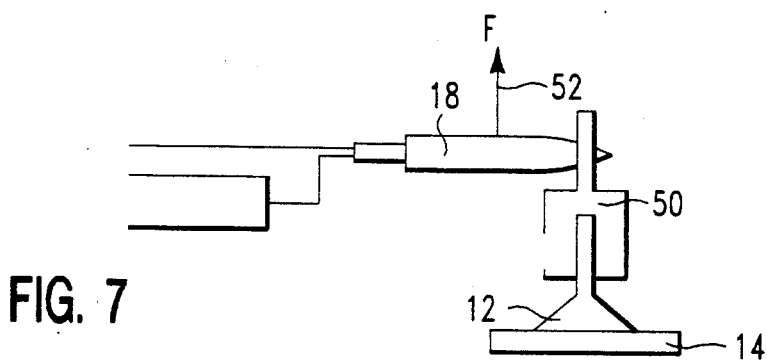
FIG. 7 is a schematic diagram of a third embodiment according to the invention as used for pin removal.

FIG. 7 illustrates a final embodiment of the invention. It is desired to monitor the adhesion of a pin (or a wire) being removed from a substrate. In this figure, substrate 12 is an I/O pin and substrate 14 is a ceramic substrate. Pin 12 is attached to stud 50, for example by a fast drying glue such as superglue cyanoacrylate adhesive or a clamping system (not shown), which is then connected to ultrasonic horn 18. Upon the application of ultrasonic energy and upward force 52, the pin 12 becomes separated from the ceramic substrate 14. The ultrasonic adhesion/dehesion monitoring apparatus according to the invention may be used to monitor the dehesion of the pin 12 to the ceramic substrate 14 and indicate when they are separated.

The apparatus according to the invention will also function as a quality monitor in that the apparatus can also indicate if the wire, chip, pin or other component is poorly bonded to the substrate or if stud 44 or 50 is loosely attached to the horn 18 or if the glue or clamping system is loose.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An ultrasonic adhesion/dehesion monitoring apparatus for monitoring the adhesion/dehesion between first and second substrates comprising:
   a. an ultrasonic source for transmitting ultrasonic energy to at least first and second substrates.
   b. means for measuring the instantaneous AC current and instantaneous AC supplied to said ultrasonic source;
   c. means for multiplying the instantaneous AC voltage and the instantaneous AC current to determine the instantaneous power supplied to said ultrasonic source; and
   d. monitor means coupled to said ultrasonic source and said instantaneous power determining means for monitoring the instantaneous power supplied to said ultrasonic source, wherein said monitor means comprises circuit means for detecting the power supplied to said ultrasonic source and process control means responsive to said power detecting means for gradually varying the power of said ultrasonic source.

2. The apparatus of claim 1 wherein the first substrate is a wire and said apparatus monitors the bonding of said wire to the second substrate.

3. The apparatus of claim 1 wherein the first substrate is a chip, chip resistor, chip transistor or surface mount component, and said apparatus monitors the removal of said chip, chip resistor, chip transistor or surface mount component, from the second substrate.

4. The apparatus of claim 1 wherein the first substrate is a pin or a wire and said apparatus monitors the removal of said pin or wire from the second substrate.

5. A method for monitoring the adhesion/dehesion between first and second substrates in an ultrasonic adhesion/dehesion monitoring apparatus comprising an ultrasonic source for transmitting ultrasonic energy to at least first and second substrates, the method comprising the steps of:
   a. measuring the instantaneous AC current and instantaneous AC voltage supplied to the ultrasonic source;
   b. multiplying the instantaneous AC voltage times the instantaneous AC current to determine the instantaneous power supplied to the ultrasonic source;
   c. monitoring the instantaneous power supplied to the ultrasonic source;
   d. detecting the power supplied to the ultrasonic source; and
   e. regulating the power of the ultrasonic source in response to the power detected in step d, wherein the step of regulating comprises gradually varying the power of the ultrasonic source.

* * * * *